(12) United States Patent
Meneghini et al.

(10) Patent No.: US 10,553,403 B1
(45) Date of Patent: Feb. 4, 2020

(54) POLYGONAL TOROIDAL PLASMA SOURCE

(71) Applicant: MKS Instruments, Inc., Andover, MA (US)

(72) Inventors: Paul Michael Meneghini, Rowley, MA (US); Shaun Smith, Portland, OR (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/406,339

(22) Filed: May 8, 2019

(51) Int. Cl.
*H01J 7/24* (2006.01)
*H01J 37/32* (2006.01)

(52) U.S. Cl.
CPC .... *H01J 37/32357* (2013.01); *H01J 37/3244* (2013.01); *H01J 37/32009* (2013.01); *H01J 37/32431* (2013.01); *H01J 2237/002* (2013.01)

(58) Field of Classification Search
CPC ............... H01J 37/32009; H01J 37/32431
USPC ............... 315/111.11, 111.41, 111.51
See application file for complete search history.

(56) References Cited

U.S. PATENT DOCUMENTS

| | | | |
|---|---|---|---|
| 6,150,628 A | 11/2000 | Smith et al. | |
| 6,388,226 B1 | 5/2002 | Smith | |
| 6,418,874 B1 | 7/2002 | Cox et al. | |
| 6,815,633 B1 * | 11/2004 | Chen | H01J 27/16 156/345.38 |
| 7,166,816 B1 | 1/2007 | Chen et al. | |
| 7,501,600 B2 | 3/2009 | Holber et al. | |
| 8,053,700 B2 | 11/2011 | Schuss et al. | |
| 9,275,839 B2 | 3/2016 | Chen et al. | |
| 2012/0031876 A1 | 2/2012 | Shajii et al. | |
| 2012/0212136 A1 * | 8/2012 | Einav | H01J 37/321 315/111.41 |

* cited by examiner

*Primary Examiner* — Thuy V Tran
(74) *Attorney, Agent, or Firm* — Proskauer Rose LLP

(57) ABSTRACT

A plasma source is provided that includes multiple metallic blocks. A toroidal plasma chamber and a transformer are substantially embedded in the metallic blocks. The toroidal plasma chamber includes a gas inlet configured to receive a process gas and a gas outlet configured to expel at least a portion of the process gas from the plasma chamber. The plasma chamber also includes multiple linear channel segments, multiple joints, an inlet joint, and an outlet joint machined into the metallic blocks. Each of the inlet joint, the outlet joint, and the joints connects a pair of the linear channel segments. The linear channel segments, the joints, the inlet joint and the outlet joint in combination form the toroidal plasma chamber. The gas inlet is disposed on the inlet joint. The gas outlet is disposed on the outlet joint. An inner angle of each of the joints is greater than about 90 degrees.

26 Claims, 7 Drawing Sheets

POLYGONAL TOROIDAL PLASMA SOURCE

FIELD OF THE INVENTION

The present invention generally relates to the field of plasma generation and processing equipment and, more particularly, to improved structures for plasma generation and processing.

BACKGROUND

Plasma discharges can be used to excite gases to produce activated gases containing ions, free radicals, atoms and molecules. Activated gases are used for numerous industrial and scientific applications, including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e., a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other applications include etching of and depositing material into high aspect ratio structures. Other applications require shielding the material being processed from the plasma because the material is sensitive to damage caused by ions or because the process has high selectivity requirements.

Plasmas can be generated in various ways including direct current (DC) discharge, radio frequency (RF) discharge, and microwave discharge. DC discharges are achieved by applying a potential between two electrodes in a gas. RF discharges are achieved either by capacitively or inductively coupling energy from a power supply into a plasma. Microwave discharges can be produced by coupling a microwave energy source to a discharge chamber containing a gas.

Plasma discharges can be generated in a manner such that both the charged species constituting the plasma and the neutral species, which can be activated by the plasma, are in intimate contact with the material being processed. Alternatively, the plasma discharge can be generated remotely from the material being processed, so that relatively few of the charged species come into contact with the material being processed, while the neutral species can still contact it. Such a plasma discharge is commonly termed a remote or downstream plasma discharge. As an example, a remote plasma source can generate plasma outside of a process chamber, such as in a remote device mounted on the chamber, and deliver reactive species and byproducts of the plasma into the process chamber. Depending on its construction, positioning relative to the material being processed, and operating conditions (e.g., gas species, pressure, flow rate, and power coupled into the plasma), a plasma source can have characteristics of either or both of these two general types.

A remote plasma source can be constructed as a toroidal plasma source in which electrical current is induced around a closed loop path inside of a gas, thereby creating a plasma that is approximately toroidal in shape. Specifically, in a remote toroidal plasma source, a gas enters the plasma source and is split into two paths that converge at the exit of the device to create a looped path of the gas inside of the plasma source. Electrical current is inductively coupled into the gas and circulate around the looped path to form toroidal-shaped plasma in the device. Additional gas enters the plasma source, mixes and reacts with the plasma in the plasma source, and then exits the plasma source carrying the reactive byproducts of the plasma to a process chamber.

There are currently two methods for constructing remote toroidal plasma sources. One involves constructing the internal plasma chamber of a remote toroidal plasma source entirely from a dielectric material, such as the methods disclosed in U.S. Pat. No. 7,501,600. The other approach involves constructing a plasma chamber by assembling metallic blocks (e.g., aluminum blocks) with internal cavities that are anodized to create a dielectric barrier to the gas and with dielectric breaks around the toroidal loop, such as the methods disclosed in U.S. Pat. Nos. 6,150,628 and 6,388,226. The second method of constructing a plasma source using metallic blocks is generally preferable due to the ease of fabrication and cooling and lowered cost.

In general, plasma created in a remote toroidal plasma source seeks a round shape along the inner diameter of the toroidal gas path because this is the shortest and lowest resistance path for current to circulate. However, in a toroidal plasma source made from one or more metallic blocks, a rounded shape is difficult to machine inside of the blocks. Instead, existing approaches machine relatively linear cavities into the metallic blocks and the resulting looped path is formed from multiple straight sections. For instance, FIG. 1 shows a prior art remote toroidal plasma source 100 with a plasma channel crated from two metallic blocks 102a, b with four straight channel segments 104a-d machined into the blocks 102a, b. The blocks 102a, b are assembled such that the channel segments 104a-d are positioned at right angles relative to each other. Thus, the resulting looped plasma channel 106 is rectangular with four nearly 90° turns 108a-d. One shortcoming associated with such an angular looped plasma channel 106 is that the plasma is likely to hit the inner walls of the inside corners of the turns 108a-d, which can erode the anodized coating in the channel, leading to poor performance, particle generation and premature device failure. In fact, dielectric failure from plasma-channel wall interactions constitutes a major failure mode and is a life-limiting event for a plasma source.

Substantial efforts and expenses have been put into preventing plasma interactions with inner walls of a plasma channel with limited success. One typical approach is to enlarge and control the radii of the internal corners of a plasma channel. However, access to these locations is limited due to difficulty in accessing the embedded angular turns, such as the 90° internal corners 108a-d of the plasma channel 106 of FIG. 1. Expensive flow based methods, such as vapor honing or hand polishing, are often used to obtain access to and enlarge these locations, which do not offer the cost or repeatability advantages of a fully automated machining process. Another known technique for limiting plasma-wall interactions is carefully tuned fluid mechanics. Generally, gas outside of a plasma has a much higher density than the plasma itself and this outside layer of gas can push the plasma away from the walls in the corner of a plasma channel and elsewhere. Thus, much effort has been focused on injecting the gas into a plasma channel in such a way as to create a protective layer that spins around the plasma in the plasm channel, thereby preventing the plasma from interacting with the channel walls. These efforts are often complex, expensive and involve additional structures to inject gas at multiple locations. For example, FIG. 2 shows another prior art remote toroidal plasma source 200 with a plasma channel 202 and one or more upstream gas plenums 204 in addition to the main gas inlet 206. These additional gas plenums 204 distribute gas injection locations to the sharp 90° corners 208 of the plasma channel 202, as described in U.S. Pat. No. 9,275,839. The additional injection points 204 used to spin the gas around the plasma in the plasma channel 202 are burdensome and expensive because they involve the construction of additional seals, coatings and parts with complex drill patterns.

SUMMARY

The present invention features an improved remote toroidal plasma source that can be used in semiconductor manufacturing processes. In some embodiments, the improved plasma source is constructed from multiple metallic blocks (e.g., aluminum blocks) that form a polygonal toroidal plasma channel with a looped path substantially rounder than that of a traditional plasma source, such as the plasma sources 100 and 200 of FIGS. 1 and 2 with rectangular plasma channels. The polygonal toroidal plasma channel of the present invention can have one or more obtuse internal angles that reduce the tendency of the plasma to hit the internal walls of the channel. As an example, the remote toroidal plasma source of the present invention can be constructed from multiple anodized aluminum blocks. A toroidal plasma channel in the shape of a polygon with six or more sides and obtuse inner angles can be embedded in the aluminum blocks. In some embodiments, the plasma source of the present invention includes a transformer substantially embedded in the metallic blocks and/or one or more cooling structures at least partially embedded in the metallic blocks.

In one aspect, a plasma source is provided. The plasma source includes a plurality of metallic blocks, a toroidal plasma chamber embedded in the metallic blocks, and a transformer substantially embedded in the metallic blocks. The toroidal plasma chamber includes a gas inlet configured to receive a process gas, a gas outlet configured to expel at least a portion of the process gas from the plasma chamber, and a plurality of linear channel segments, a plurality of joints, an inlet joint, and an outlet joint machined into the metallic blocks. Each of the inlet joint, outlet joint, and the plurality of joints connects a pair of the linear channel segments. The linear channel segments, the joints, the inlet joint and the outlet joint in combination form the toroidal plasma chamber. The gas inlet is disposed on the inlet joint. The gas outlet is disposed on the outlet joint. An inner angle of each of the joints is greater than about 90 degrees. In addition, the transformer of the plasma source includes a plurality of ferrite members embedded in the metallic blocks and encircling at least one linear channel segment of the toroidal plasma chamber. The transformer also includes a plurality of primary windings positioned adjacent to an inner diameter of the toroidal plasma chamber.

In another aspect, a method for manufacturing a plasma source is provided. The method includes providing a plurality of metallic blocks, forming an embedded toroidal plasma chamber within the metallic blocks, and forming a transformer into the metallic blocks by embedding a plurality of ferrite members within the metallic blocks and wrapping one or more primary windings around a section of each ferrite member. Forming the embedded toroidal plasma chamber includes drilling a plurality of linear channel segments, a plurality of joints, an inlet joint and an outlet joint into the metallic blocks, where each joint, inlet joint and outlet joint connects a pair of the linear channel segments.

Forming the embedded toroidal plasma chamber also includes disposing a gas inlet on the inlet joint, disposing a gas outlet on the outlet joint, forming each of the plurality of joints to create an inner angle of greater than about 90 degrees; and assembling the metallic blocks such that the linear channel segments embedded in the respective metallic blocks are aligned to form a toroidal plasma channel within the toroidal plasma chamber.

Any of the above aspects can include one or more of the following features. In some embodiments, the plurality of linear channel segments of the plasma chamber are at least six linear channel segments. In some embodiments, the plurality of metallic blocks are at least two metallic blocks. The plurality of metallic blocks can be aluminum blocks.

In some embodiments, the plasma source includes a plurality of cooling plates. Each cooling plate is in physical contact with an outer surface of at least one of the metallic blocks to cool the plasma chamber and the transformer embedded therein. In some embodiments, the cooling plates are at least partially embedded in the metallic blocks while being in physical contact with the outer surface of the metallic blocks.

In some embodiments, the gas inlet is the only inlet of the plasma chamber for receiving the process gas. In some embodiments, each metallic block includes (i) a portion of at least two linear channel segments and (ii) at least one of the plurality of joints, the inlet joint or the outlet joint connected to the at least two linear channel segments.

In some embodiments, the metallic blocks are fixedly attached at multiple interfaces such that the linear channel segments embedded in the metallic blocks are aligned to form a toroidal plasma channel within the toroidal plasma chamber. A vacuum seal and a dielectric break can be disposed at each of the interfaces. In some embodiments, each ferrite member is embedded at an interface between a pair of the metallic blocks, the ferrite member being encased in a ferrite chamber formed by a pair of pockets machined into respective ones of the metallic blocks. In some embodiments, one or more of the primary windings are wrapped around a section of the ferrite member. The primary windings are substantially encased in the ferrite chamber formed by the corresponding pockets of the pair of metallic blocks at the interface. The ferrite chamber can be filled with a thermal interface material.

In some embodiments, each ferrite member is molded as a unitary piece that includes a rounded annulus section and a trapezoidal section. The rounded annulus section of each ferrite member is positioned adjacent to an outer diameter of the plasma chamber, and the trapezoidal section of each ferrite member is positioned adjacent to the inner diameter of the plasma chamber. A portion of the trapezoidal section has one or more of the primary windings wrapped thereto.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

DETAILED DESCRIPTION

Figure 3:
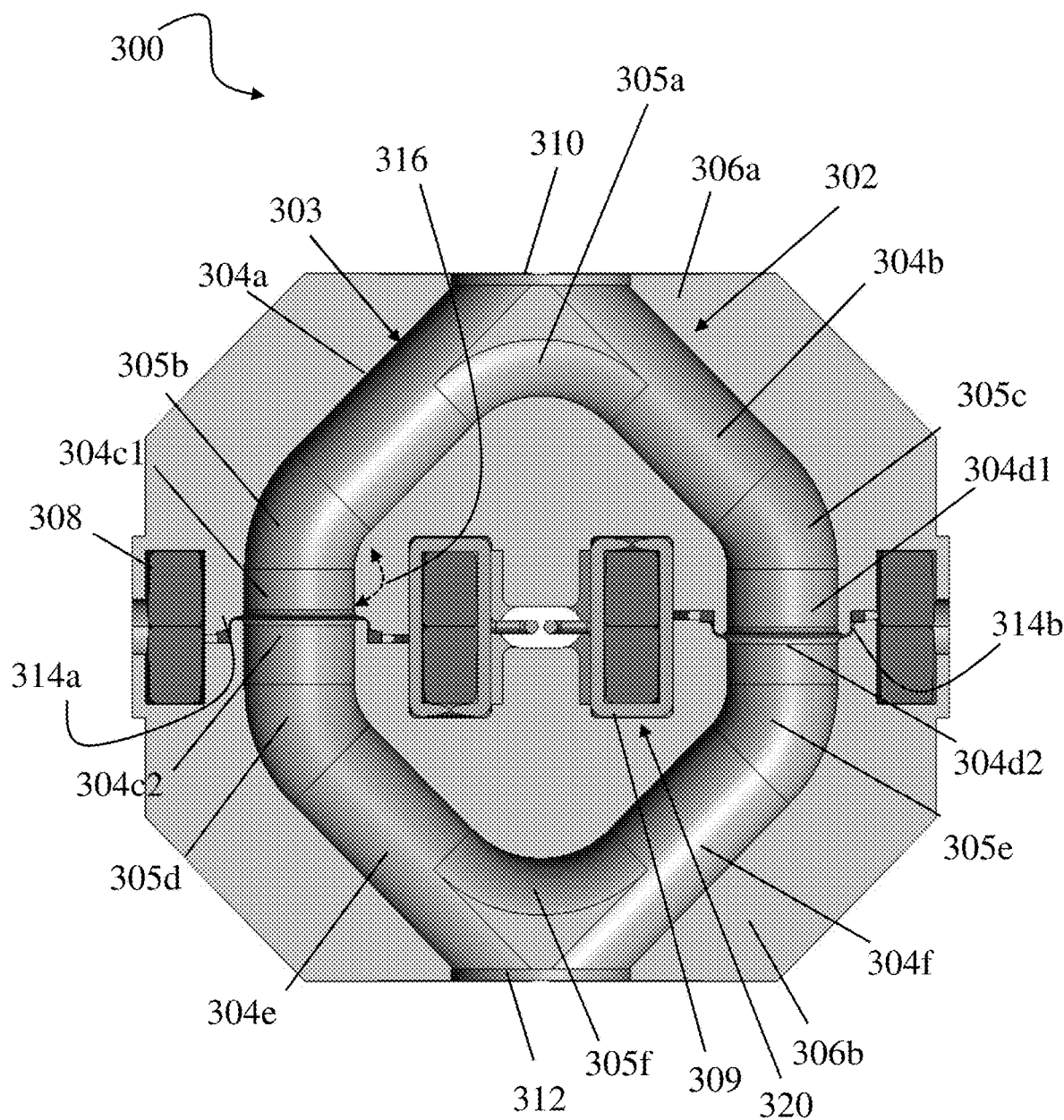
FIG. 3 shows a sectional view of an exemplary remote toroidal plasma source, according to some embodiments of the present invention.

FIG. 3 shows a sectional view of an exemplary remote toroidal plasma source 300, according to some embodiments of the present invention. The plasma source 300 generally includes a toroidal plasma chamber 302 that comprises a toroidal plasma channel 303, a gas inlet 310 and a gas outlet 312. The toroidal plasma channel 303, which defines a looped, closed path, is formed by multiple plasma channel segments (304a-f, generally referred to as 304) and multiple joints (305a-f, generally referred to as 305), all of which are embedded in two or more metallic blocks (306a and b, generally referred to as 306). The metallic blocks 306 can comprise a metal material, such as aluminum, coated with a dielectric material or anodized to create a dielectric barrier on the interior surface of the channel segments 304. The plasma source 300 also includes a transformer 320 with one or more magnetic cores 308 and primary windings 309 substantially embedded in the metallic blocks 306. Each magnetic core 308, configured to surround at least one plasma channel segment 304, is in electrical communication with an AC power supply (not shown). As gas enters the plasma channel 303 via the gas inlet 310, inductive energy radiated from the magnetic cores 308 powered by the power supply ionizes the gas to create a plasma in the plasma channel 303. This plasma can exit the plasma channel 303 via the gas outlet 312 and enter a downstream plasma processing chamber (not shown) that includes at least one wafer to be processed.

In general, the plasma channel segments 304 are linear. The plasma channel segments 304 and joints 305 are arranged to form the toroidal plasma channel 303 having a polygonal shape, such as a hexagonal or octagonal shape. In some embodiments, the polygonal shape of the plasma channel 303 is substantially symmetrical. In some embodiments, the polygonal toroidal plasma channel 303 is formed by six or more channel segments 304 and six or more joints 305 machined into two or more metallic blocks 306. The multiple joints 305 can include (i) an inlet joint 305a having the gas inlet 310 disposed thereon to receive a process gas into the plasma channel 303, (ii) an outlet joint 305f having the gas outlet 312 disposed thereon to expel at least a portion of the process gas from the plasma channel 303, and (iii) one or more remaining internal joints 305b-e. In some embodiments, an inner angle 316 of each interior joint 305b-e of the polygonal toroidal plasma channel 303 is obtuse (i.e., greater than 90 degrees) so as to create a plasma path that is substantially rounder than a traditional plasma channel with rectangular joints (e.g., the prior art plasma source 100 of FIG. 1). The rounded obtuse joints of a polygonal toroidal plasma channel 303 are adapted to reduce the tendency of the plasma in the plasma channel 303 to hit channel walls, thereby eroding the anodized coating in the channel 303, which can lead to poor performance, particle generation and premature device failure.

In some embodiments, each metallic block 306 is machined to include at least one joint 305 fluidly connecting at least a portion of a pair of the channel segments 304. Upon assembly, the metallic blocks 306 are configured to be fixedly attached to each other at multiple interfaces (314a and b, generally referred to as 314) such that the linear channel segments 304 embedded in the metallic blocks 306 are aligned to form the polygonal toroidal plasma channel 303.

As shown in FIG. 3, the plasma chamber 302 has a hexagonal-shaped toroidal plasma channel 302 formed by six channel segments 304a-f and six joints 305a-f embedded in two metallic blocks 306a, b. Specifically, a first metallic block 306a includes the inlet joint 305a directly connected to two complete channel segments 304a, b machined into the first metallic block 306a. The first metallic block 306a also includes a first internal joint 305b connected to the complete channel segment 304a and a partial channel segment 304c1 machined into the first metallic block 306a. The first metallic block 306a further includes a second internal joint 305c connected to the complete channel segment 304b and a partial channel segment 304d1 machined into the first metallic block 306a. Similarly, the second metallic block 306b includes the outlet joint 305f directed connected to two complete channel segments 304e, f machined into the second metallic block 306b. The second metallic block 306b also includes a first internal joint 305d connected to the complete channel segment 304e and a partial channel segment 304c2 machined into the second metallic block 306b. The second metallic block 306b further includes a second internal joint 305e connected to the complete channel segment 304f and a partial channel segment 304d2 machined into the second metallic block 306b. Upon fixedly attaching the first and second metallic blocks 306a, b at interfaces 314a, b, the partial channel segments 304c1, 304c2 align to form a complete channel segment 304c at the interface 314a, and the partial channel segments 304d1, 304d2 align to form a complete channels segment 304d at the interface 314b. Moreover, upon assembly of the two metallic blocks 306a, b, the channel segments 304a-f are fluidly connected to form a hexagonal-shaped toroidal plasma channel 303 of the plasma chamber 302.

Figure 4:
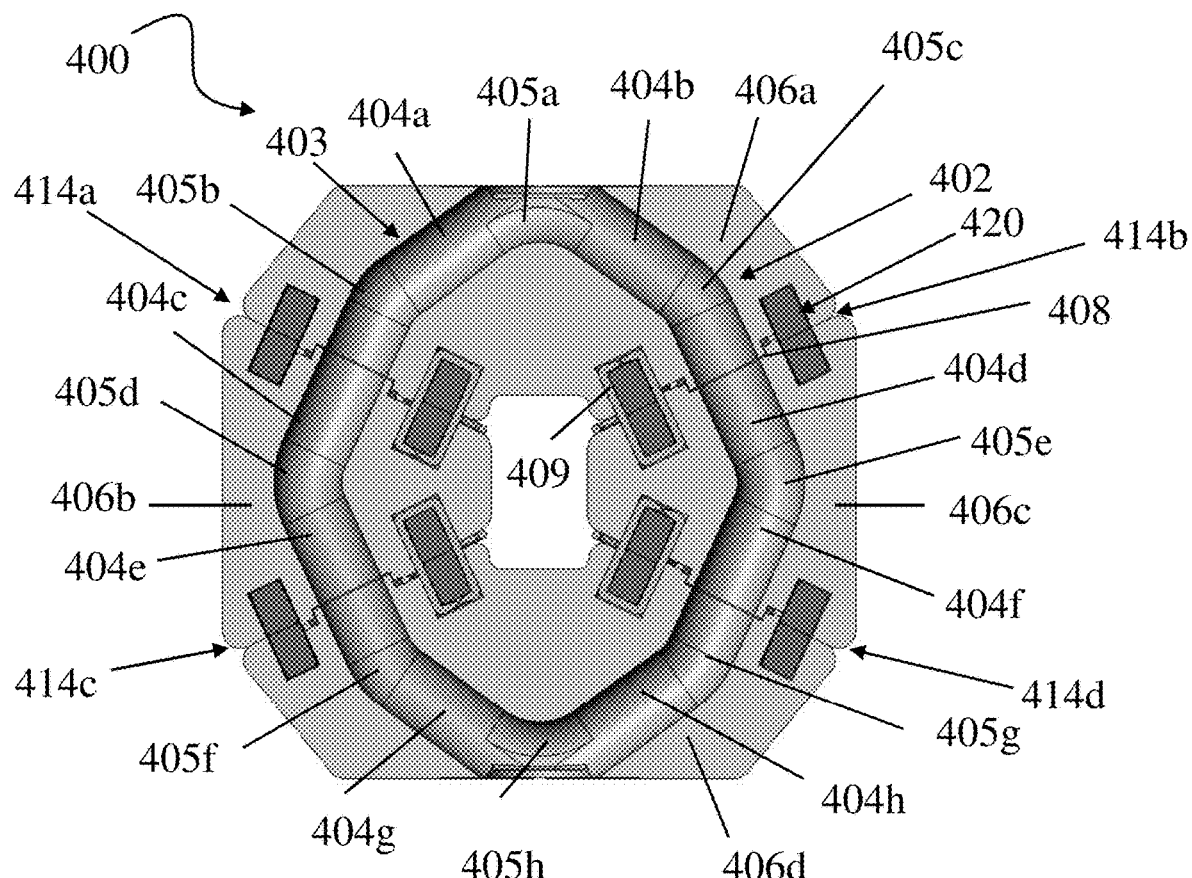
FIG. 4 shows a sectional view of another exemplary remote toroidal plasma source, according to some embodiments of the present invention.

FIG. 4 shows a sectional view of another exemplary remote toroidal plasma source 400, according to some embodiments of the present invention. The plasma chamber 402 of the plasma source 400 has an octagonal toroidal plasma channel 403 formed by eight channel segments 404*a-h* and eight joints 405*a-h* machined into four metallic blocks 406*a-d*. Thus, the larger plasma source 400 has two additional midsection metallic blocks 406*b*, 406*c* in comparison to the plasma source 300 of FIG. 3. Generally, the number of sides in a polygonal toroidal plasma channel increases with each metallic block added. Similar to the plasma source 300, the inner angles of the internal joints 405*b-g* of the plasma channel 403 are obtuse to produce a substantially rounded toroidal shape. As understood by a person of ordinary skill in the art, the present invention also contemplates plasma sources with polygonal toroidal plasma channels having more than eight sides, where the interior joints are obtuse. This generally requires an increased number of channel segments and joints machined into an increased number of metallic blocks.

Figure 5:
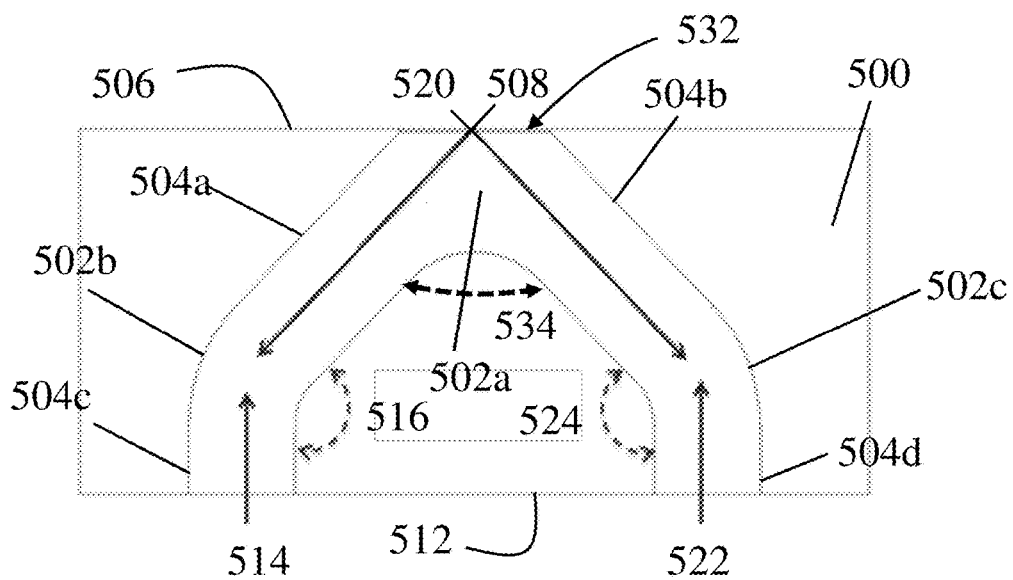
FIG. 5 shows a sectional view of exemplary drilling operations for creating at least a portion of a plasma channel in a metallic block, according to some embodiments of the present invention.

In some embodiments, the polygonal shape of a plasma channel embedded in two or more metallic blocks is formed by machining internal cavities into the metallic blocks. Specifically, each metallic block of a plasma source includes at least one machined internal gas path comprising a portion of at least two linear channel segments connected to a joint, such as an inlet joint, outlet joint or interior joint. If the joint is an interior joint, the gas in the gas path turns at an obtuse angle while traveling through the interior joint. FIG. 5 shows a sectional view of exemplary drilling operations for creating at least a portion of a plasma channel in a metallic block, according to some embodiments of the present invention. The operations explained with reference to FIG. 5 can be used to machine the plasma channel 303 of FIG. 3 and the plasma channel 403 of FIG. 4. Generally, for a given metallic block, each interior joint can be manufactured with two blind drill operations by machining from opposite sides of the block to meet in the interior of the block at an obtuse angle that forms an interior joint.

As shown in FIG. 5, to form the interior joint 502*b* within the metallic block 500, channel segment 504*a* is drilled into the metallic block 500 from one side 506 of the block 500 along a first direction 508 towards the interior of the block 500. Channel segment 504*c* is drilled into the metallic block 500 from the opposite side 512 in a second direction 514 toward the interior of the block 500. The two drilling operations are adapted to meet at an obtuse angle 516, where the interior joint 502*b* is formed. Similar operations can be used to form the second interior joint 502*c*, which includes drilling two channel segments 504*b*, 504*d* from the opposite sides 506, 512 of the block 500 along respective directions 520, 522 until they meet at an obtuse angle 524 forming the joint 502*c*. For a metallic block that also includes an inlet joint or an outlet joint, such as the metallic block 500 of FIG. 5 that has an inlet joint 502*a*, the inlet joint 502*a* is formed by the intersection of the two channel segments 504*a*, 504*b* that are connected to the two different interior joints 502*b*, 502*c*, respectively. As shown, the channel segments 504*a*, 504*b* intersect on one side 506 of the block 500 to form the inlet joint 502*a*, which has a gas inlet 532 disposed thereon.

In some embodiments, the inner angle 534 of the inlet joint 502*a* is not obtuse. The inner angle 534 can be an acute angle or a right angle. Having an obtuse angle at the inlet joint 502*a* may not be important because this is the location of gas injection. Specifically, a gas can be injected into the plasma channel via the gas inlet 532 using a convention injection method to reduce plasma—channel wall interactions. For example, a gas can be injected into the plasma chamber in such a way as to lift the plasma off of the surface of the inlet joint 502*a* as well as establish a spinning pattern such that a gas field is formed around the plasma in the plasma channel that is tangential to the channel directions 520, 508. Because the gas injection method already minimizes the interaction between the plasma in the plasma channel and the plasma channel walls at the inlet joint 502*a*, it is not as important to ensure that the inner angle 534 of the inlet joint 502*a* is obtuse, in contrast to the inner angles of the interior joints 502*b*, 502*c* that do not have a gas entrance or exit. In some embodiments, a plasma chamber of the present invention only has one inlet for receiving a process gas. For example, the gas inlet 310 of FIG. 3 is the only gas inlet for the plasma chamber 302, and the gas inlet 410 of FIG. 4 is the only gas inlet for the plasma chamber 402. Additional gas injection structures and locations in a plasma chamber may not be required because the interior joints of the plasma channel are smooth and obtuse to minimize plasma interactions with the walls of the plasma channel. In alternative embodiments, the inlet joint of a plasma channel is also obtuse.

In some embodiments, the inner angle of an outlet joint on which a gas outlet is disposed, such as the outlet joint 305*f* of FIG. 3 or the outlet joint 405*h* of FIG. 4, is not obtuse. For a metallic block that includes an outlet joint with a gas outlet, the momentum of the exiting gas usually lifts the plasma off of the joint walls, thus does not require an obtuse angle to prevent further plasma-channel wall interactions. In alternative embodiments, the outlet joint of a plasma channel is also obtuse.

Figure 6:
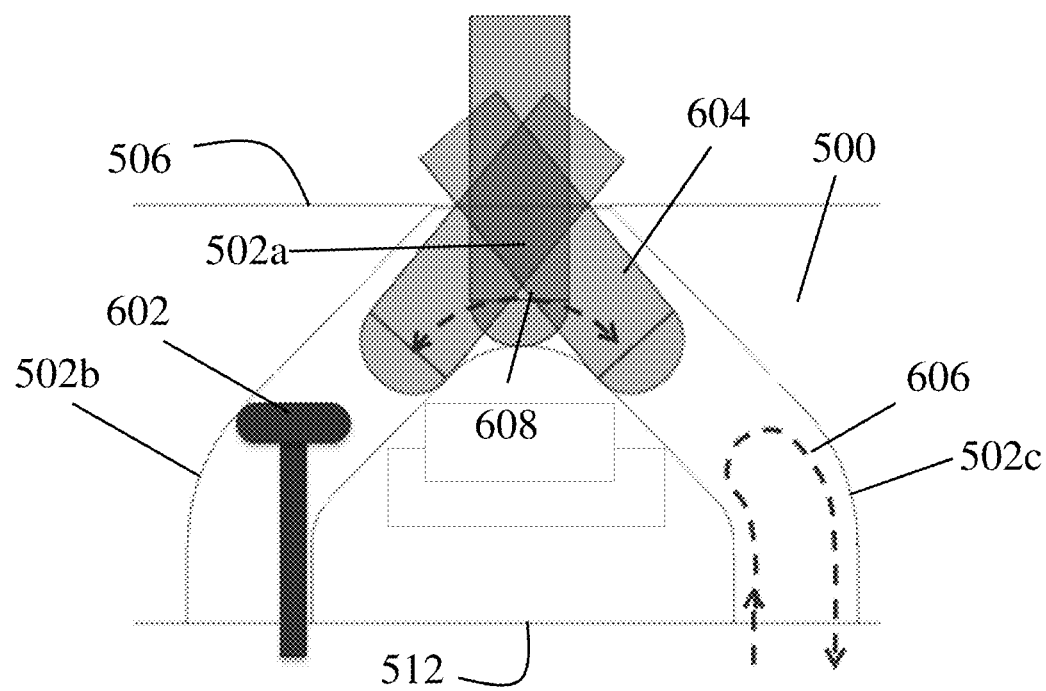
FIG. 6 shows exemplary tools that can be used to fillet different sections of the plasma channel portion embedded in the metallic block of FIG. 5, according to some embodiments of the present invention.

In some embodiments, the drilling operations for forming the plasma channel with multiple channel segments and joints are followed by one or more filleting operations to smoothen the surfaces of the internal joints where the drilling operations meet. As described above, to minimize plasma interactions with the walls of the plasma channel, a shape of the plasma channel is substantially round, such as polygonal with six sides or more. This means that a fillet radius of each interior joint of the plasma channel needs to be maximized. However, to best propagate the rotating gas field around the plasma, a substantial round cross section with a substantially constant diameter is desired through the obtuse turn of an interior joint. These competing design goals need to be balanced with the additional need of ensuring access to the radius of an interior joint embedded in a metallic block using a fillet tool. Forming an interior joint of a plasma channel having an obtuse inner angle achieves these goals. FIG. 6 shows exemplary tools that can be used to fillet different sections of the plasma channel portion embedded in the metallic block 500 of FIG. 5, according to some embodiments of the present invention. As shown, a lollipop fillet tool 602 is used to smooth the walls of the plasma channel at an interior joint location, such as at the interior joint 502*b* or 502*c*. For example, the lollipop fillet tool 602 can fillet the inner diameter and the outer diameter of the interior joint 502*b* or 502*c* along a tool path that enters and exits from the side 512 of the metallic block 500, such as the tool path 606 for filleting the interior joint 502*c*. The obtuse inner angle of the interior joint 502*b* or 502*c* offers significantly better access to the lollipop fillet tool 602 in comparison to a prior art interior joint with a right angle. In addition, a ball end mill 604 can be used to fillet the inlet joint 502*a*. In FIG. 6, the ball end mill 604 is illustrated in three different positions as the tip of the tool 604 rotates while traveling along the path 608 to fillet the inlet joint 502*a*. In some embodiments, filleting the various joints of a polygonal toroidal plasma source using the lollipop fillet tool 602 and the ball end mill 604 is fully automated using robotic equipment, thereby greatly increasing access to the embedded interior joint locations while preserving the cost and repeatability advantages of a fully automated filleting process.

Figure 1:
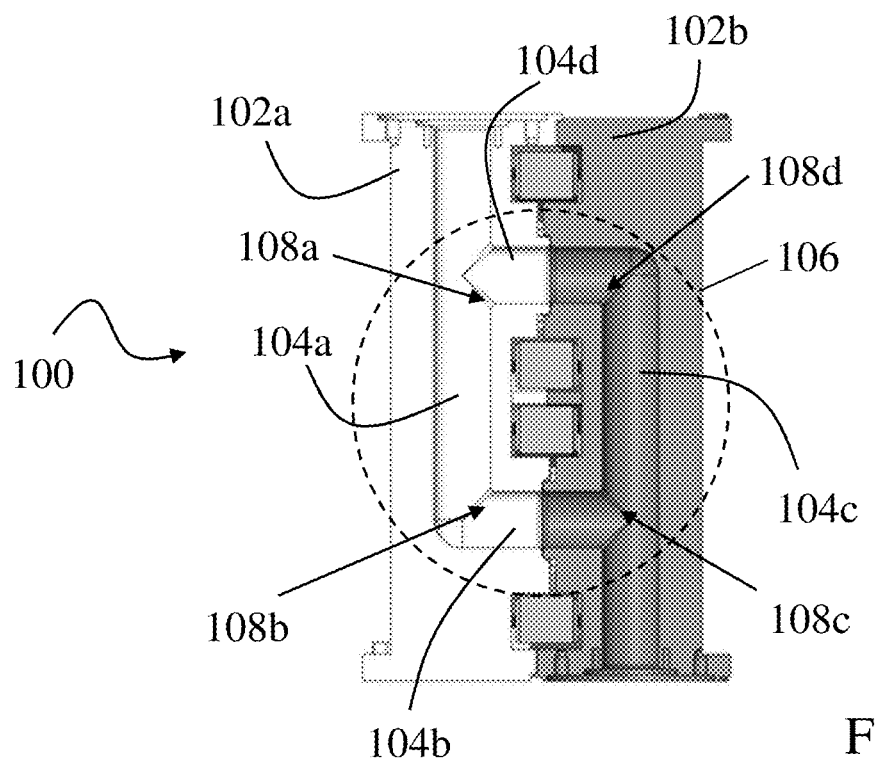
FIG. 1 shows a prior art remote toroidal plasma source.
Figure 2:
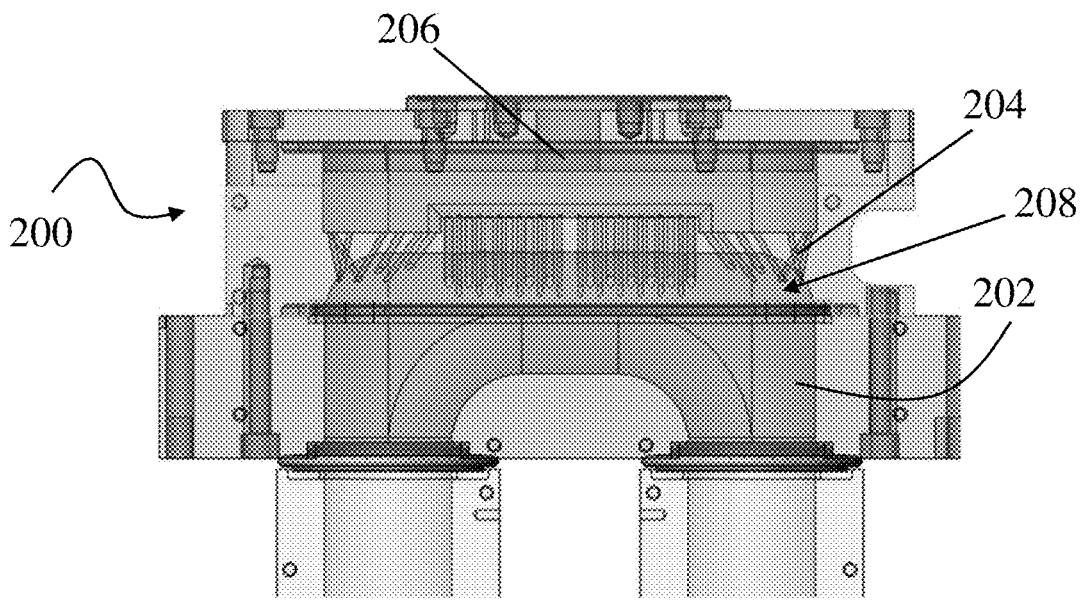
FIG. 2 shows another prior art remote toroidal plasma source.

Therefore, for a plasma source of the present invention, such as the plasma source 300 of FIG. 3 or the plasma source 400 of FIG. 4, the obtuse inner angles that define the interior joints of the toroidal plasma channel in the plasma source, combined with large and smooth fillets at these interior joints, create a rounded toroidal gas path through the plasma channel. Because a plasma channel of the present invention has a substantially rounder toroidal shape (e.g., the hexagonal shape of FIG. 3 or the octagonal shape of FIG. 4) than a prior art rectangular plasma channel, as shown in FIGS. 1 and 2, the plasma channels of the plasma sources of the present invention are inherently more robust against the occurrence of the plasma hitting the walls at the joints of the plasma channels. A plasma source of the present invention also better maintains and propagates the protective rotating gas layer around the plasma in the plasma channel, thereby simplifying the gas injection scheme. For example, as explained above, only one gas inlet is required for receiving a process gas, instead of multiple inlets in a prior art plasma source, such as the plasma source 200 of FIG. 2. Further, as explained above, the inlet joint of the plasma channel at which the gas inlet is disposed does not need to be obtuse. The inner angle of the inlet joint can be acute or right-angled.

Figure 7:
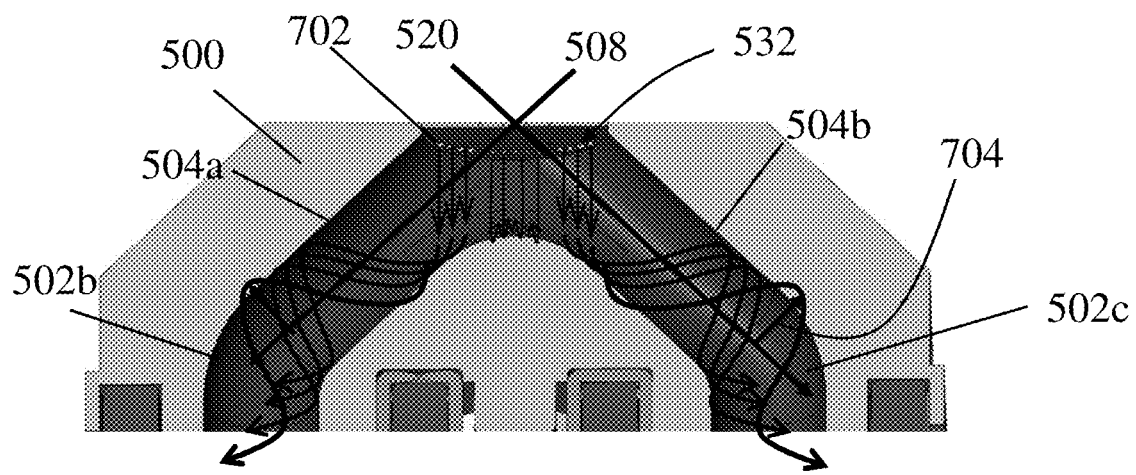
FIG. 7 shows an exemplary propagation pattern of a process gas inside of the plasma channel portion embedded in the metallic block of FIG. 5, according to some embodiments of the present invention.

FIG. 7 shows an exemplary propagation pattern of a process gas inside of the plasma channel portion embedded in the metallic block 500 of FIG. 5, according to some embodiments of the present invention. As shown, a process gas is injected into the plasma channel via the gas inlet 532. In some embodiments, the gas inlet 532 is the only inlet to the plasma channel. The gas inlet 532 can be constructed to include multiple straight holes 702 around an edge of the inlet 532. These straight holes 702 can be configured to introduce a swirl tangent 704 to the incoming gas to prevent the plasma in the plasma channel from impinging on the interior wall. Exemplary embodiments of the inlet 532, including the straight holes 702, can be found in U.S. Pat. Nos. 6,872,909 and 6,388,226, which are assigned to MKS Instruments, Inc., of Andover, Mass., the contents of which are hereby incorporated herein by reference in their entirety. The polygonal toroidal shape of the plasma channel combined with the obtuse inner angles 516, 524 and large smooth fillets of the interior joints 502b, 502c of the channel allows the swirl tangent 704 of the process gas to propagate through the channel, substantially preventing the plasma from impinging on the interior walls of the channel. For example, as shown in FIG. 7, the process gas is able to preserve its swirling pattern while traveling through the interior joints 502b, 502c. In contrast, a prior art interior joint with a right or acute angle, such as in the prior art structure 100 of FIG. 1, is likely to break the swirling flow of the process gas, thereby enabling interaction of the plasma with the walls of the plasma channel at the joint locations.

Figure 8:
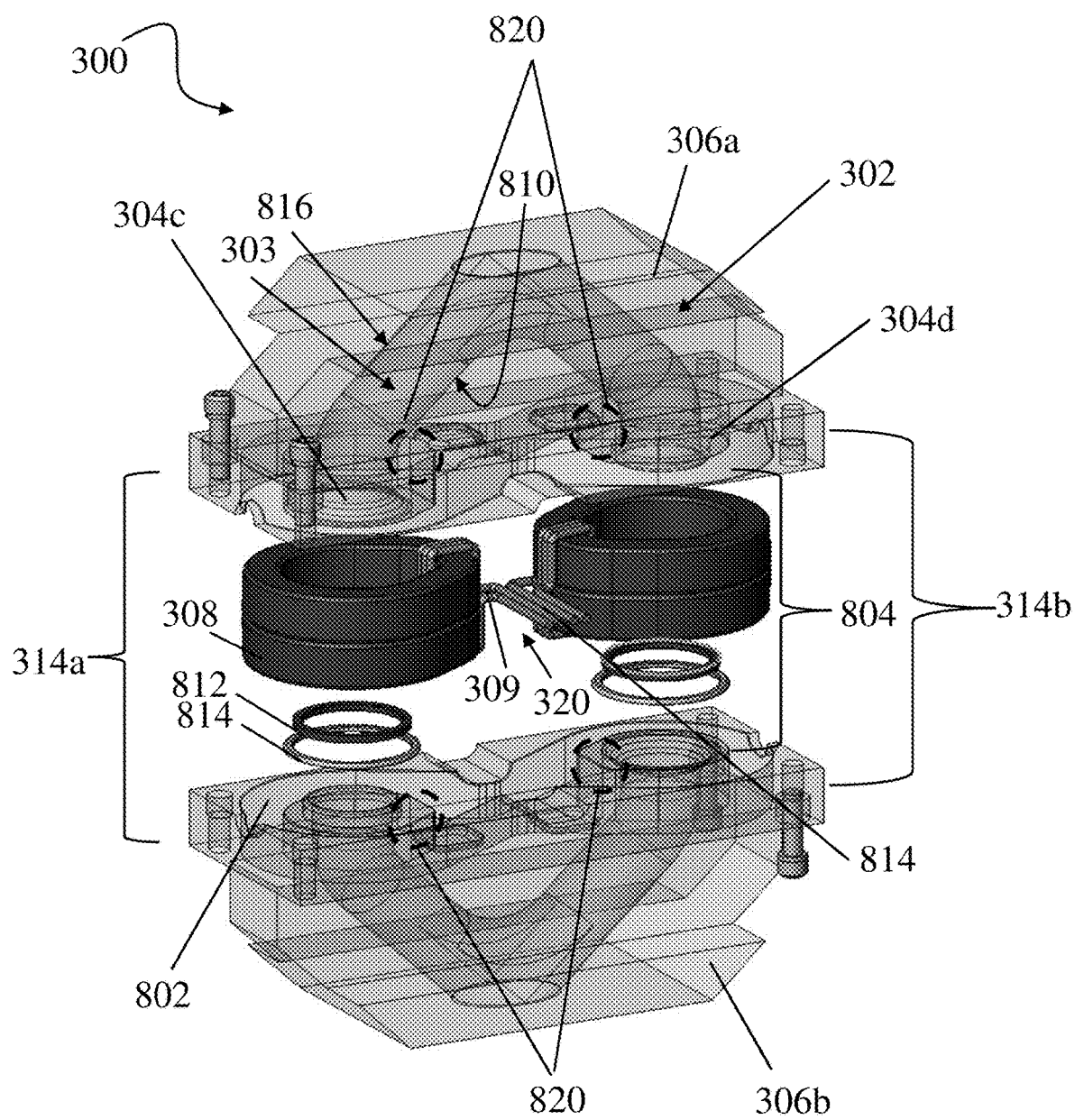
FIG. 8 shows an exploded view of an exemplary assembly of the plasma source of FIG. 3 that includes the toroidal plasma chamber and the transformer embedded in the metallic blocks, according to some embodiments of the present invention.

In another aspect, the present invention features a transformer substantially embedded in a metallic block assembly that also has a polygonal toroidal plasma chamber embedded therein, such as the plasma source 300 of FIG. 3 or the plasma source 400 of FIG. 4. As explained above, an embedded plasma chamber can be constructed by assembling two or more metallic blocks such that the internal plasma channel segments and joints align and form a polygonal (e.g., hexagonal or octagonal) plasma channel. FIG. 8 shows an exploded view of an exemplary assembly of the plasma source 300 of FIG. 3 that includes the toroidal plasma chamber 302 and the transformer 320 embedded in the metallic blocks 306a, b, according to some embodiments of the present invention. The two metallic blocks 306a, b can be fixedly attached to each other via at least two interfaces 314a, b such that the linear channel segments 304 embedded in the metallic blocks 306 are aligned to form the polygonal toroidal plasma channel 303 of the plasma chamber 302. In some embodiments, each of the interfaces 314a, 314b include a dielectric break 812, which can be in the form of a ceramic O-ring, and a vacuum seal 814, which can be in the form of a polymer O-ring concentrically positioned relative to the dielectric O-ring 812

In some embodiments, the transformer 320 includes (i) one or more magnetic cores 308 in the form of ferrite members and (ii) one or more primary windings 309. The ferrite members 308 and the primary windings 309 can also be embedded into the metallic blocks 306a, b at the interfaces 314a, b. Generally, each ferrite member 308 is embedded at an interface 314 between a pair of the metallic blocks 306, where each ferrite member 308 is adapted to encircle a plasma channel segment 304. In addition, the primary windings 309 wrap around at least a section of each ferrite member 308 and are positioned adjacent to an inner diameter 810 of the plasma chamber 302. As shown in FIG. 8, two ferrite members 308 are stacked together and encircle the linear plasma channel segment 304c at interface 314a, and two ferrite members 308 are stacked together and encircle the linear plasma channel segment 304d at interface 314b.

In some embodiments, each ferrite member 308 is disposed in a ferrite pocket 802 that is machined into a metallic block 306 from its interface surface and around the vacuum sealing features 814. Specifically, a ferrite pocket 802 can be configured to accommodate at least one ferrite member 308, along with primary windings 209 wrapped around a section of the ferrite member 308, with as little void space as possible. In some embodiments, the thickness of the metallic blocks 306a, b at the inner diameter 810 of the plasma chamber 302 along the interfaces 314a, b is larger than the thickness of the metallic blocks 306a, b at other locations to promote conductive cooling. In FIG. 8, areas 820 of the metallic blocks 306a, b with enlarged thickness are circled. Generally, one of the hottest places in the plasma source 300 is along the inner diameter 810 of the plasma chamber 302 due to the fact that the plasma in the plasma chamber 302 tends to hug close to the inner diameter 810, thus creating a much larger heat flux along the inner diameter 810 than along the outer diameter 816. In addition, it is fairly difficult to place a cooling structure to be sufficiently close to the inner diameter 810 to provide effective cooling. Therefore, increasing the thickness of the metallic blocks 306a, b around the ferrite pockets 802 in the area 820 adjacent to the trapezoidal section 904 of the ferrite members 308 (i.e., adjacent to the inner diameter 810 of the plasma chamber 302) can facilitate removal of heat through increased conduction. As shown, this thickness can be controlled by the geometry of the pockets 802 used to house the ferrite members 308, especially to accommodate the trapezoidal section 904 of the ferrite members 308. In some embodiments, to ensure proper thermal coupling of the ferrite member 308 to the metallic blocks 306, which is often cooled by a cooling system as explained below, a thermal interface medium is used to fill the void space of each ferrite pocket 802, such as a thermal grease, film or potting material.

Upon joining the two metallic blocks 306a, b at the two interfaces 314a, b, each interface forms a ferrite chamber 804 from the respective ferrite pockets 802 to substantially encase the ferrite members 308 and the primary windings 309 in the respective pockets 802. Hence, the ferrite members 308 and the primary winding 309 of the transformer 320 are substantially embedded within the two metallic blocks 306a, b. As shown, a stacked configuration of the ferrite members 308 can be formed within each ferrite chamber 804. The void space of each ferrite chamber 804 can be filled with a thermal interface material. In some embodiments, each ferrite pocket 802 accommodates at least one ferrite member 308, which means that the resulting ferrite chamber 804 encloses two or more ferrite members 308 at each metallic block interface. In alternative embodiments, a ferrite chamber 804 encloses one ferrite member 308 at each metallic block interface.

Figure 9:
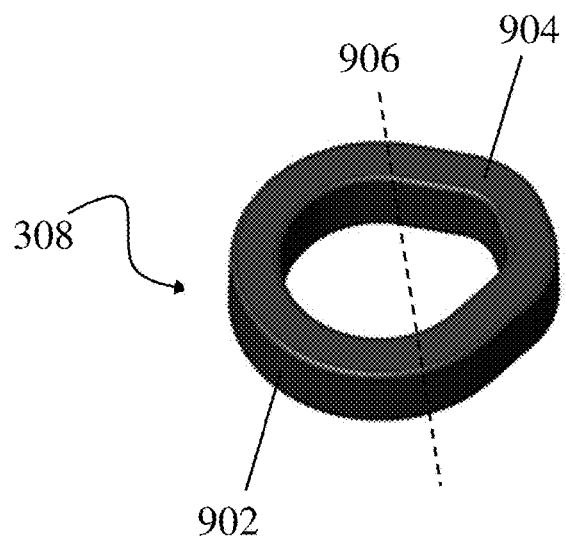
FIG. 9 shows an exemplary geometry of a ferrite member of the transformer of FIG. 8, according to some embodiments of the present invention.

In some embodiments, each ferrite member 308 is custom molded to create a geometry that maximizes cooling and magnetic performance as well as minimizes foot print and material waste. FIG. 9 shows an exemplary geometry of a ferrite member 308 of the transformer 320 of FIG. 8, according to some embodiments of the present invention. Such a geometry is compatible with the arrangement of the transformer 320 shown in FIG. 8, where the primary windings 309 are located on the inner diameter 810 of the plasma chamber 302 with the leads 814 of the primary windings 309 entering and exiting from the center of the plasma chamber 302. As shown in FIG. 9, the molded ferrite member 308 is a unitary piece that includes a rounded annulus section 902 and a trapezoidal section 904 separated by the boundary line 906. The rounded annulus section 902 is positioned adjacent to the outer diameter 816 of the plasma chamber 302 and designed to hug close to the outer diameter 816 so as to minimize the size and footprint of the metallic block 306 that houses the ferrite member 308. The trapezoidal section 904 of the ferrite member 308 is positioned adjacent to the inner diameter 810 of the plasma chamber 302 and is designed to provide space for the primary windings 309 while moving the primary windings 309 away from the inner diameter 810 of the plasma chamber 302 and increasing the total amount of coupling ferrite material in the transformer 320.

In some embodiments, a transformer structure 420, similar to the transformer 320 explained above with respect to FIGS. 8 and 9, is constructed for the plasma source 400 of FIG. 4. As shown in FIG. 4, the transformer 420, which includes the ferrite members 408 and primary windings 409, are substantially embedded in the metallic blocks 406a-d at the interfaces 414a-d. Specifically, at each interface, a ferrite chamber (not shown) is formed to enclose at least one ferrite member 408 and its primary windings 409, where each ferrite chamber is substantially the same as the ferrite chamber 804 of FIG. 8. Further, as clearly understood by a person of ordinary skill in the art, a similar transformer structure can be constructed for any polygonal toroidal plasma source of the present invention.

In another aspect, the present invention features systems and methods for cooling the polygonal toroidal plasma source of the present invention. Traditionally, one or more cold plates are clamped onto each metallic block to reduce the high heat generated by the plasma within the plasma chamber embedded in the metallic blocks. Traditional cooling systems also require additional cooling structures for a second heat source in the form of the transformer, which includes the ferrite members and the primary windings. For example, in a prior art plasma source with a traditional cooling system, cold plates are clamped directly onto opposite sides of a metallic block. Thus only one surface of a cold plate cools a metallic block in a single dimension. In addition, because the ferrite members of the transformer of the prior art plasma source have at least a portion located outside of the cooled metallic blocks, a separate designated cooling structure, such as heat sinks, cold plates or heat pipes, is used to cool the transformer, which incurs additional complexity and expense.

In contrast, for a polygonal toroidal plasma source of the present invention, the transformer, which includes the ferrite members and primary windings, are substantially embedded inside of the metallic block assembly. This eliminates the need for additional cooling structures dedicated to the transformer, which reduces the complexity and expense of the plasma source. In some embodiments, only a cooling structure, such as one or more cold plates, are used the cool the metallic block assembly, which in turn cools the transformer embedded therein. In some embodiment, the cooling structure for the metallic block assembly are also substantially embedded in the metallic blocks, thus capable of cooling the metallic block assembly with more than one side of the cooling structure (e.g., three sides of each cold plate). This greatly improves the efficiency of cooling by enabling heat flow in multiple dimensions, reducing the conductive path to the heat sources, and increasing the conductive area to the metallic blocks.

Figure 10A:
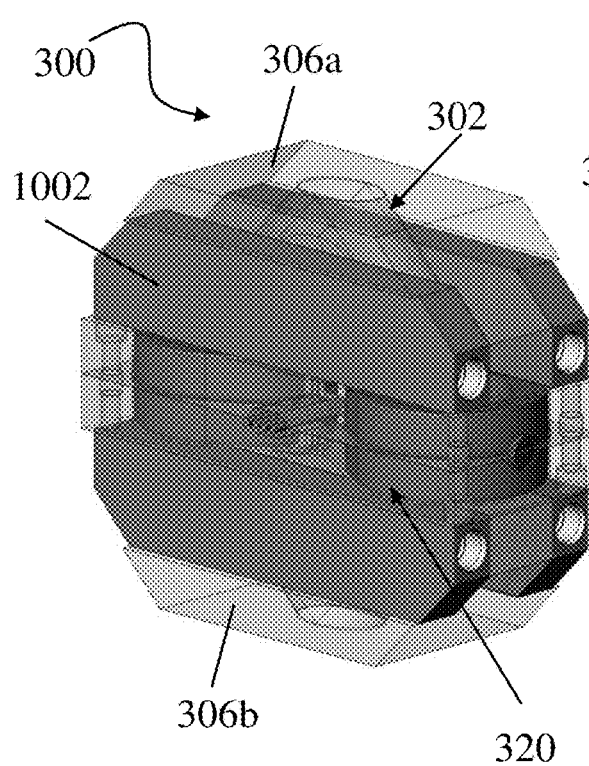
FIGS. 10a and 10b show isometric and sectional views, respectively, of the plasma source of FIG. 3 with a cooling system coupled thereto, according to some embodiments of the present invention.
Figure 10B:
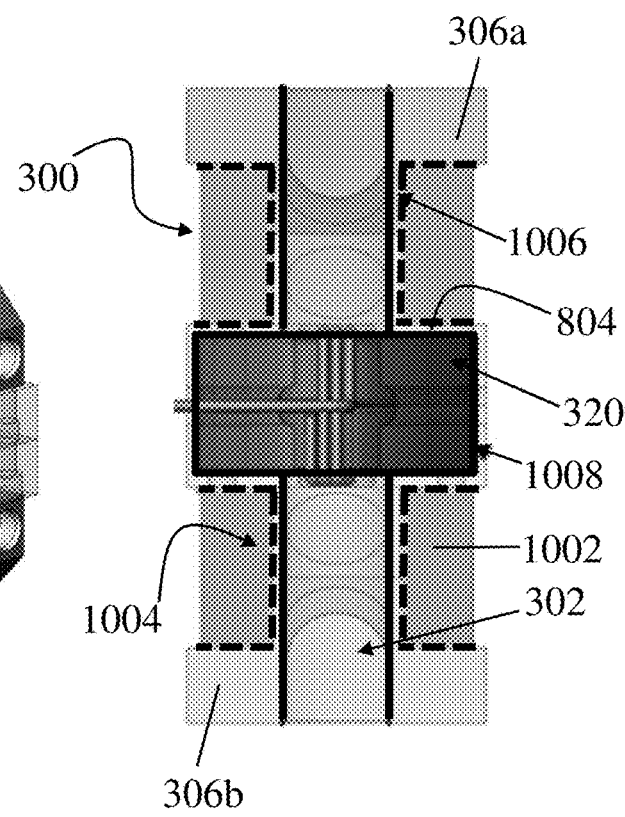

FIGS. 10a and 10b show isometric and sectional views, respectively, of the plasma source 300 of FIG. 3 with a cooling system coupled thereto, according to some embodiments of the present invention. As shown, two cold plates 1002 are generally attached to opposite external surfaces of each metallic block 306, with a total of four cold plates 1002 used to cool the two metallic blocks 306a, b. These cold plates 1002 are configured to dissipate the high heat load generated by the plasma within the plasma chamber 302 of the plasma source 300. The transformer 320 embedded in the metallic blocks 306 constitutes an additional heat load, as well as creates more stringent temperature requirements due to the operational temperature limits of the ferrite members 308. In some embodiments, to meet these increased cooling requirements, the cold plates 1002 are at least partially embedded in the metallic blocks 306. As shown, two recesses 1004 are machined on opposite sides of each metallic block 306, where each recess 1004 is dimensioned to receive a cold plate 1002. Since the metallic blocks 306 need to be sufficiently large to have the transformer 320 embedded therein, there is enough unused volume in each metallic block 306 to machine the recesses 1004 for accommodating the cold plates 1002. Such a recessed structure facilitates two-dimensional cooling by utilizing at least three sides 1006 of each cold plate 1002 to cool the metallic blocks 306, where these sides represent an interface between the cold plates 1002 and the metallic blocks 306. Further, as shown in FIGS. 10a and 10b, at least one side of each cold plate 1002 is adjacent to a ferrite chamber 804 housing a portion of the transformer 320, thus effectively cools the transformer portion. Improved cooling is also realized by moving the cooling surfaces 1006 closer to the heated surfaces 1008 of at least two heat sources—the plasma chamber 302 and the transformer 320. In some embodiments, a thermal interface material, such as grease, films or pads, are applied to the cooling surfaces 1006 to reduce thermal impedance and compensate for mechanical tolerances.

The cooling system described above with reference to FIGS. 10a and 10b can be generalized to polygonal toroidal plasma sources with any number of sides. For example, for each metallic block used in a plasma source, two cold plates can be recessed and attached to the external surfaces of the metallic block to provide cooling for the metallic block, including the embedded portions of the plasma chamber and transformer.

Figure 11:
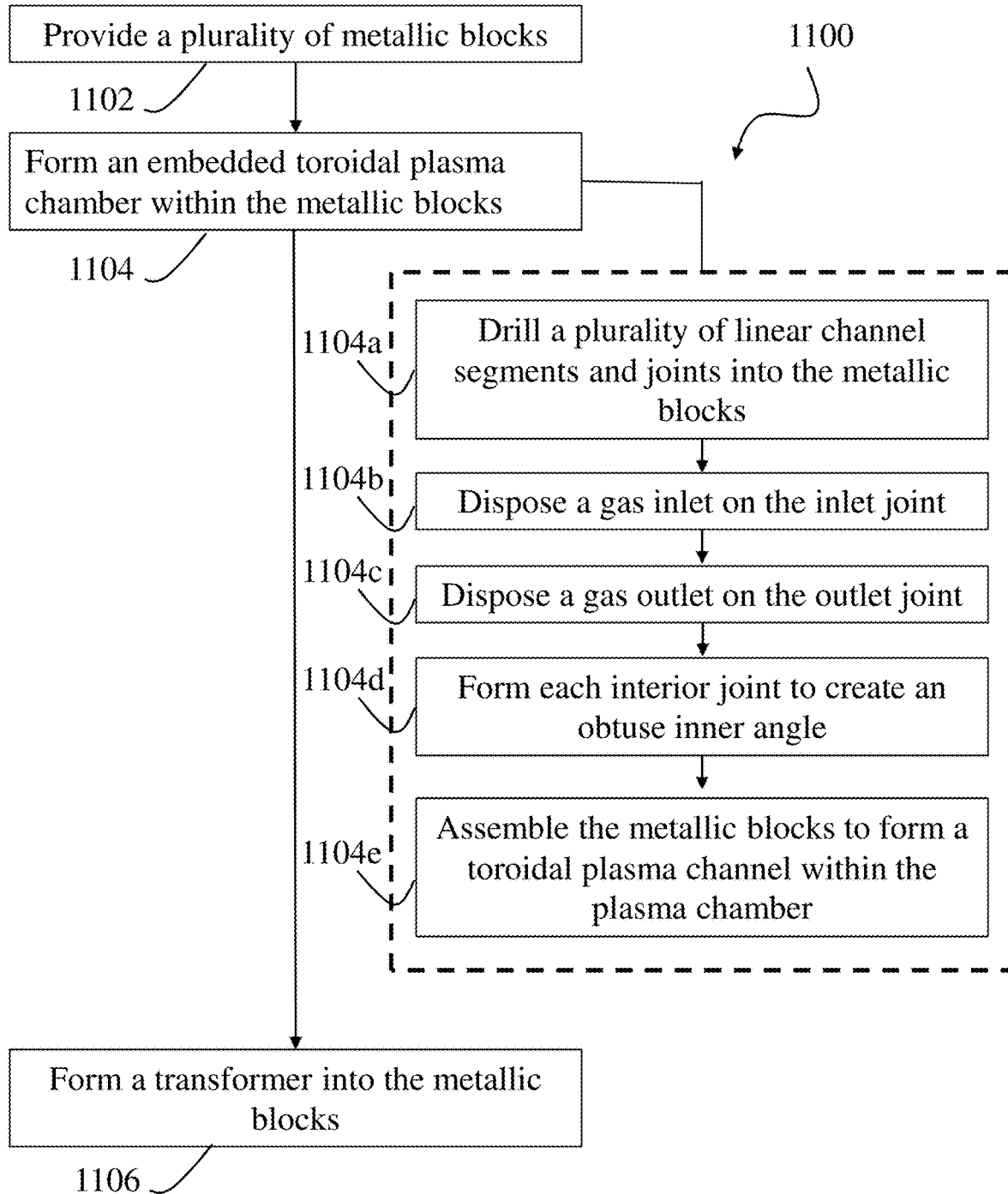
FIG. 11 shows an exemplary process for manufacturing a polygonal toroidal plasma source, such as the plasma source of FIG. 3 or FIG. 4, according to some embodiments of the present invention.

FIG. 11 shows an exemplary process 1100 for manufacturing a polygonal toroidal plasma source, such as the plasma source 300 of FIG. 3 or the plasma source 400 of FIG. 4, according to some embodiments of the present invention. The process 1100 starts at step 1102 by providing multiple metallic blocks, such as aluminum blocks, for constructing the plasma source. For example, for a hexagonal plasma source, at least two metallic blocks are used. For an octagonal plasma source, at least four metallic blocks are used.

At step 1104, a polygonal toroidal plasma chamber is machined into the metallic blocks such that the plasma chamber is substantially embedded within the blocks. This can include, at step 1104a, drilling multiple linear channel segments connected by joints into the metallic blocks, such as using the approaches described above with reference to FIGS. 5 and 6. In general, each joint, which can be an inlet joint, an outlet joint, or an interior joint, connects a pair of the linear channel segments. At step 1104b, a gas inlet is disposed on the inlet joint. In general, the polygonal toroidal plasma chamber can have one or more inlets for receiving a process gas. The process gas can be injected into the plasma chamber via the inlet to introduce a swirl tangent to the incoming gas. At step 1104c, a gas outlet is disposed on the outlet joint, where the gas outlet is configured to allow at least a portion of the process gas to exit from the plasma chamber. In some embodiments, each metallic block is machined to include at least one joint and two connecting channel segments embedded therein. For example, for a metallic block containing a gas inlet or outlet, the block is machined to include at least three joints (an inlet or outlet joint and at least two interior joints), along with their connecting channel segments. For midsection metallic blocks, each can be machined to include at least one interior joint with two connecting linear channel segments.

At step 1104d, the interior joints of the plasma chamber are formed to create an inner angle that is obtuse, i.e., greater than about 90 degrees. The obtuse angle allows the resulting polygonal shape of the plasma channel to be substantially rounded, which minimizes plasma-channel wall interactions, among many other benefits described above. At step 1104e, the metallic blocks, after having channel segments and joints machined into them, are aligned and assembled to form the toroidal plasma chamber.

At step 1106, a transformer is embedded in the metallic blocks, such as using the approach described above with respect to FIG. 8. For example, at each interface between two metallic blocks, a ferrite chamber can be machined into the metallic blocks to house at least two ferrite members with primary windings wrapped around a section of the ferrite members. Each ferrite member can be constructed to encircle a linear channel segment of the plasma channel and have a geometry illustrated and explained above with respect to FIG. 9.

In some embodiments, the process 1100 further includes coupling one or more cold plates to the metallic blocks such that each cold plate is at least partially embedded (e.g., recessed) in the metallic blocks, as explained above with reference to FIGS. 10a and 10b. These cold plates are adapted to cool the metallic block assembly, which includes both the embedded plasma chamber and transformer.

As explained above, the polygonal toroidal plasma source of the present invention reduces the occurrence of interactions between the plasma in the plasma channel and the walls of the plasma channel, which can lead to lower erosion rates of the dielectric coating in the channel, resulting in fewer particles generated, fewer dielectric barrier failures and longer life for the device. This reduction can be accomplished by creating a polygonal toroidal plasma channel that is substantially rounded, such has having six or more sides, with obtuse inner angles and smooth large fillets at the interior joints of the plasma channel along the gas path. Further, this geometry simplifies and improves gas injection into the plasma chamber by eliminating the need to distribute gas injection at multiple locations along the plasma channel. Instead, in some embodiments, only a single gas inlet is used to receive a process gas while maintaining substantially the same gas propagation qualities as a plasma channel with multiple injection sites. As a result, there are fewer parts and seals for the plasma sources of the present invention, leading to lower costs and higher reliability. In addition, the present invention eliminates the need for a complex cooling system that uses separate cooling mechanisms for the metallic blocks and the transformer. Such reduction results in few parts, lower costs and better cooling of the plasma source. This can be accomplished by embedding the transformer inside of the metallic blocks, thereby using only one cooling structure (e.g., one or more cold plates) to cool both the transformer and the plasma chamber embedded in the metallic blocks. Further, the recessed/embedded cooling capability of the present invention increases the cooling surfaces and reduces the conductive path to the heat sources in the plasma source, thereby improving cooling performance, extending the operating space of the plasma source, and facilitating the removal of additional cooling structures for the transformer.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma source comprising;
    a plurality of metallic blocks;
    a toroidal plasma chamber embedded in the metallic blocks, the toroidal plasma chamber including:
        a gas inlet configured to receive a process gas;
        a gas outlet configured to expel at least a portion of the process gas from the plasma chamber;
        a plurality of linear channel segments, a plurality of joints, an inlet joint, and an outlet joint machined into the metallic blocks, each of the inlet joint, the outlet joint, and the plurality of joints connecting a pair of the linear channel segments, wherein (i) the linear channel segments, the joints, the inlet joint and the outlet joint in combination form the toroidal plasma chamber, (ii) the gas inlet is disposed on the inlet joint, (iii) the gas outlet is disposed on the outlet joint, and (iv) an inner angle of each of the joints is greater than about 90 degrees; and
    a transformer substantially embedded in the metallic blocks, the transformer including:
        a plurality of ferrite members embedded in the metallic blocks and encircling at least one linear channel segment of the toroidal plasma chamber; and
        a plurality of primary windings positioned adjacent to an inner diameter of the toroidal plasma chamber.

2. The plasma source of claim 1, wherein the plurality of linear channel segments are at least six linear channel segments.

3. The plasma source of claim 2, wherein the plurality of metallic blocks are at least two metallic blocks.

4. The plasma source of claim 1, wherein the plurality of metallic blocks are aluminum blocks.

5. The plasma source of claim 1, further comprising a plurality of cooling plates, wherein each cooling plate is in physical contact with an outer surface of at least one of the metallic blocks to cool the plasma chamber and the transformer.

6. The plasma source of claim 5, wherein the cooling plates are at least partially embedded in the metallic blocks.

7. The plasma source of claim 1, wherein the gas inlet is the only inlet of the plasma chamber for receiving the process gas.

8. The plasma source of claim 1, wherein each metallic block includes (i) a portion of at least two linear channel segments and (ii) at least one of the plurality of joints, the inlet joint or the outlet joint connected to the at least two linear channel segments.

9. The plasma source of claim 1, wherein the metallic blocks are fixedly attached at multiple interfaces such that the linear channel segments embedded in the metallic blocks are aligned to form a toroidal plasma channel within the toroidal plasma chamber.

10. The plasma source of claim 9, further comprising a vacuum seal and a dielectric break at each of the interfaces.

11. The plasma source of claim 9, wherein each ferrite member is embedded at an interface between a pair of the metallic blocks, the ferrite member being encased in a ferrite chamber formed by a pair of pockets machined into respective ones of the metallic blocks.

12. The plasma source of claim 11, wherein one or more of the primary windings are wrapped around a section of the ferrite member, the primary windings are substantially encased in the ferrite chamber formed by the corresponding pockets of the pair of metallic blocks at the interface.

13. The plasma source of claim 11, where the ferrite chamber is filled with a thermal interface material.

14. The plasma source of claim 1, wherein each ferrite member is molded as a unitary piece that includes a rounded annulus section and a trapezoidal section.

15. The plasma source of claim 14, wherein the rounded annulus section of each ferrite member is positioned adjacent to an outer diameter of the plasma chamber, and the trapezoidal section of each ferrite member is positioned adjacent to the inner diameter of the plasma chamber, a portion of the trapezoidal section has one or more of the primary windings wrapped thereto.

16. A method for manufacturing a plasma source, the method comprising;
providing a plurality of metallic blocks;
forming an embedded toroidal plasma chamber within the metallic blocks comprising:
drilling a plurality of linear channel segments, a plurality of joints, an inlet joint and an outlet joint into the metallic blocks, each joint, inlet joint and outlet joint connecting a pair of the linear channel segments;
disposing a gas inlet on the inlet joint;
disposing a gas outlet on the outlet joint;
forming each of the plurality of joints to create an inner angle of greater than about 90 degrees; and
assembling the metallic blocks such that the linear channel segments embedded in the respective metallic blocks are aligned to form a toroidal plasma channel within the toroidal plasma chamber; and
forming a transformer into the metallic blocks by embedding a plurality of ferrite members within the metallic blocks and wrapping one or more primary windings around a section of each ferrite member.

17. The method of claim 16, wherein the gas inlet is the only inlet of the plasma chamber for receiving a process gas.

18. The method of claim 16, wherein each metallic block includes (i) a portion of at least two linear channel segments and (ii) at least one of the joints, the inlet joint or the outlet joint connecting the at least two linear channel segments.

19. The method of claim 16, wherein assembling the metallic blocks comprises fixedly attaching the metallic blocks at multiple interfaces to form the toroidal plasma chamber.

20. The method of claim 19, further comprising forming a vacuum seal and a dielectric break at each of the interfaces.

21. The method of claim 16, wherein each of the plurality of ferrite members is embedded in the metallic blocks at the multiple interfaces, each ferrite member encircling at least one linear channel segment of the plasma chamber.

22. The method of claim 21, wherein embedding a plurality of ferrite members into the metallic blocks comprises encasing each ferrite member in a ferrite chamber formed by a pair of pockets machined into respective ones of the metallic blocks at the corresponding interface.

23. The method of claim 22, further comprising:
encasing the one or more primary windings of each ferrite member in the corresponding ferrite chamber;
locating the one or more primary windings adjacent to an inner diameter of the plasma chamber; and
filling the ferrite chamber with a thermal interface material.

24. The method of claim 21, further comprising molding each ferrite member as a unitary piece including a rounded annulus section and a trapezoidal section, the annulus section adapted to be positioned adjacent to an outer diameter of the plasma chamber, and the trapezoidal section adapted to be positioned adjacent to the inner diameter of the plasma chamber, a portion of the trapezoidal section has the primary windings wrapped thereto.

25. The method of claim 21, further comprising coupling a plurality of cooling plates to the metallic blocks such that each cooling plate is at least partially embedded in the metallic blocks.

26. The method of claim 25, wherein each cooling plate is in physical contact with an outer surface of at least one of the metallic blocks to cool the plasma chamber and the transformer.

* * * * *